(12) United States Patent
Hsieh (10) Patent No.: US 9,793,882 B1
(45) Date of Patent: Oct. 17, 2017

(54) VOLTAGE CLAMP CIRCUIT

(71) Applicant: Texas Instruments Incorporated, Dallas, TX (US)

(72) Inventor: Tien-Ling Hsieh, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/369,225

(22) Filed: Dec. 5, 2016

(51) Int. Cl.
*H03M 1/12* (2006.01)
*H03K 5/08* (2006.01)
*H03K 5/24* (2006.01)

(52) U.S. Cl.
CPC ............. *H03K 5/08* (2013.01); *H03K 5/2472* (2013.01); *H03M 1/12* (2013.01)

(58) Field of Classification Search
CPC .......... H03K 5/08; H03K 5/2472; H03M 1/12
USPC ................................................. 341/150–165
See application file for complete search history.

(56) References Cited

U.S. PATENT DOCUMENTS

| 4,445,160 A * | 4/1984 | Gordon | G05F 1/571 323/226 |
| 5,134,537 A * | 7/1992 | Buss | H01H 47/325 318/434 |
| 5,329,252 A * | 7/1994 | Major | H03L 7/093 331/14 |
| 2003/0090309 A1* | 5/2003 | Hunt | H03K 5/08 327/309 |

* cited by examiner

*Primary Examiner* — Lam T Mai
(74) *Attorney, Agent, or Firm* — Gregory J. Albin; Charles A. Brill; Frank D. Cimino (57) ABSTRACT

One example includes a voltage clamp circuit. The voltage clamp circuit includes a comparator loop circuit. The comparator loop circuit includes a comparator configured to compare an input voltage provided at an input node with a clamping voltage. The comparator loop circuit also includes a transistor network interconnecting a voltage rail and the input node. The comparator can be configured to activate the transistor network to set the input voltage to be approximately equal to the clamping voltage in response to the input voltage exceeding the corresponding clamping voltage.

20 Claims, 3 Drawing Sheets

FIG. 5

VOLTAGE CLAMP CIRCUIT

TECHNICAL FIELD

This disclosure relates generally to electronic circuits, and more specifically to a voltage clamp circuit.

BACKGROUND

Analog and digital circuits are often implemented together in electronic devices that employ thin-oxide gate materials are typically used in a variety of switching applications. One such application is in analog-to-digital converters (ADCs) that can generate a digital signal in response to an analog input signal. While thin-oxide gate materials can be implemented to fabricate electronic devices at smaller sizes, such thin-oxide devices can be stressed by large voltage swings, which can result in reliability and longevity issues of the electronic devices that implement the thin-oxide devices. As a result, clamp circuits can be used to clamp the amplitudes of the voltages that can be provided to such thin-oxide devices. As a result, the amplitudes of the voltages that are provided to such devices can be limited to safe levels, thus mitigating damage to the devices.

SUMMARY

One example includes a voltage clamp circuit. The voltage clamp circuit includes a comparator loop circuit. The comparator loop circuit includes a comparator configured to compare an input voltage provided at an input node with a clamping voltage. The comparator loop circuit also includes a transistor network interconnecting a voltage rail and the input node. The comparator can be configured to activate the transistor network to set the input voltage to be approximately equal to the clamping voltage in response to the input voltage exceeding the corresponding clamping voltage.

Another example includes a voltage clamp circuit. The circuit includes a first comparator loop circuit comprising a first comparator configured to compare an input voltage with a low clamping voltage and to assert an output in response to the input voltage decreasing less than the low clamping voltage to activate at least one first transistor to set the input voltage approximately equal to the low clamping voltage. The circuit also includes a second comparator loop circuit comprising a second comparator configured to compare the input voltage with a high clamping voltage and to assert an output in response to the input voltage increasing greater than the high clamping voltage to activate at least one second transistor set the input voltage approximately equal to the high clamping voltage.

Another example includes an analog-to-digital converter (ADC) system. The system includes an input resistor interconnecting an analog voltage input and an ADC input node and a voltage clamp circuit coupled to the ADC input node. The voltage clamp circuit includes a comparator loop circuit that includes a comparator configured to compare an input voltage provided at an input node with a clamping voltage. The comparator loop circuit also includes a transistor network interconnecting a voltage rail and the input node. The comparator can be configured to activate the transistor network to set the input voltage to be approximately equal to the clamping voltage in response to the input voltage exceeding the corresponding clamping voltage. The system further includes an ADC coupled to the ADC input node and being configured to generate a digital signal based on the input voltage.

DETAILED DESCRIPTION

This disclosure relates generally to electronic circuits, and more specifically to a voltage clamp circuit. The voltage clamp circuit is configured to receive an input voltage and to provide amplitude clamping of the input voltage with respect to at least one clamping voltage. The voltage clamp circuit includes at least one comparator loop circuit. The at least one comparator loop circuit includes one or more respective comparators configured to compare the input voltage provided at an input node with a respective at least one clamping voltage. The comparator loop circuit is also configured to activate a transistor network to set the input voltage approximately equal to one of the clamping voltage(s) in response to the input voltage exceeding an amplitude of the respective at least one clamping voltage (e.g., increasing in amplitude greater than a high clamping voltage or decreasing in amplitude less than a low clamping voltage). As an example, the at least one comparator loop circuit can include a first comparator loop circuit configured to compare the input voltage with a high clamping voltage and to set the input voltage approximately equal to the high clamping voltage in response to the input voltage increasing more than the high clamping voltage, and can include a second comparator loop circuit configured to compare the input voltage with a low clamping voltage and to set the input voltage approximately equal to the low clamping voltage in response to the input voltage decreasing less than the low clamping voltage.

As an example, the comparator(s) can be configured as a self-biasing common-gate arrangement of transistors. For example, the comparator(s) can include a first pair of transistors comprising common-coupled control terminals (e.g., gate terminals of field-effect transistors (FETs)) corresponding to an output of the respective at least one comparator. The output can be coupled to a transistor network associated with the comparator loop circuit that is configured to couple the input node to a respective one of a high-voltage rail or a low-voltage rail in response to activation of the respective comparator based on the amplitude of the input voltage. The first pair of transistors can also include first terminals coupled to the input node and one of the respective at least one clamping voltage, respectively. The comparator(s) can also include a second pair of transistors arranged as a current-mirror controlled by a static current source and further comprising respective first terminals coupled to a voltage rail and second terminals coupled to second respective terminals of the first pair of transistors. The pairs of transistors can thus conduct current based on a relative amplitude of the input voltage and the respective clamping voltage, such that the current flow through the arrangement of transistors can control activation and deactivation of the transistors associated with the comparator loop circuit. Accordingly, the transistor network associated with the comparator loop circuit can provide current to and from the input node to clamp the input voltage at approximately the amplitude of a respective one of the clamping voltage(s).

Figure 1:
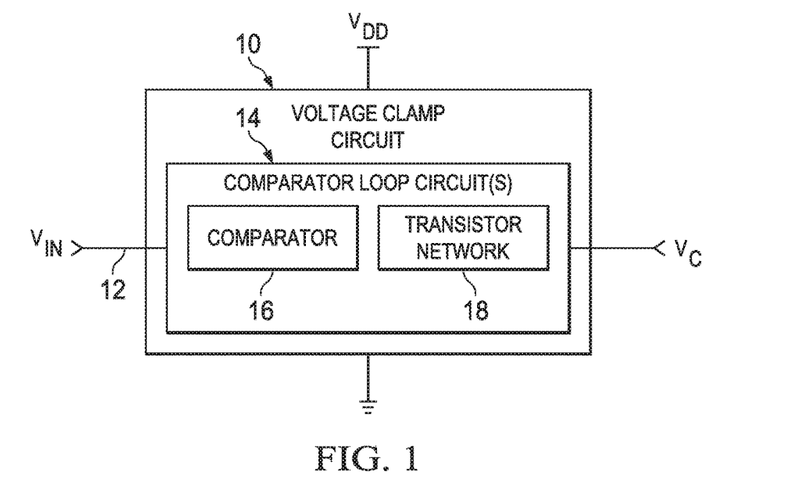
FIG. 1 illustrates an example of a voltage clamp circuit.

FIG. 1 illustrates an example of a voltage clamp circuit 10. The voltage clamp circuit 10 can be configured to clamp an input voltage $V_{IN}$ that is provided at an input node 12 at an amplitude that is approximately equal to one of at least one clamping voltage $V_C$. As an example, the clamping voltage(s) $V_C$ can be programmable (e.g., via a voltage provided to a pin, a variable resistor, or a variety of other ways), and thus can vary from one application to another. For example, the clamping voltage(s) $V_C$ can include a high clamping voltage $V_{CH}$ and a low clamping voltage $V_{CL}$, such that the voltage clamp circuit 10 can be configured to limit the amplitude of the input voltage $V_{IN}$ to be between the high and low clamping voltages $V_{CH}$ and $V_{CL}$. As an example, additional circuitry can be coupled to the input node 12, such as an analog-to-digital converter (ADC) that may benefit from limiting the amplitude of the input voltage $V_{IN}$.

The voltage clamp circuit 10 is demonstrated between a high-voltage rail $V_{DD}$ and a low-voltage rail, demonstrated in the example of FIG. 1 as ground. The voltage clamp circuit 10 includes at least one comparator loop circuit 14 that is configured to compare the amplitude of the input voltage $V_{IN}$ with the respective clamping voltage(s) $V_C$ via a comparator 16. In response to the input voltage $V_{IN}$ having an amplitude that exceeds one of the respective clamping voltage(s) $V_C$, the respective one of the comparator loop circuit(s) 14 can activate an output via the respective comparator 16 to activate a transistor network 18 to set the input voltage $V_{IN}$ approximately equal to the respective clamping voltage $V_C$.

As an example, the transistor network 18 can be configured to couple the input node 12 to a voltage source, such as corresponding to a rail voltage (e.g., the high-voltage rail $V_{DD}$ or ground) or the respective clamping voltage $V_C$. As a result, the transistor network 18 can provide current from the voltage (e.g., the rail voltage or the respective clamping voltage $V_C$) to the input node 12, such as in response to the input voltage decreasing less than a low clamping voltage. Similarly, the transistor network 18 can provide current from the input node 12 to the voltage source, such as in response to the input voltage $V_{IN}$ increasing greater than the clamping voltage $V_C$. Accordingly, the amplitude of the input voltage $V_{IN}$ can be clamped at approximately the amplitude of the respective clamping voltage $V_C$ between clamping voltages $V_{CH}$ and $V_{CL}$.

Figure 2:
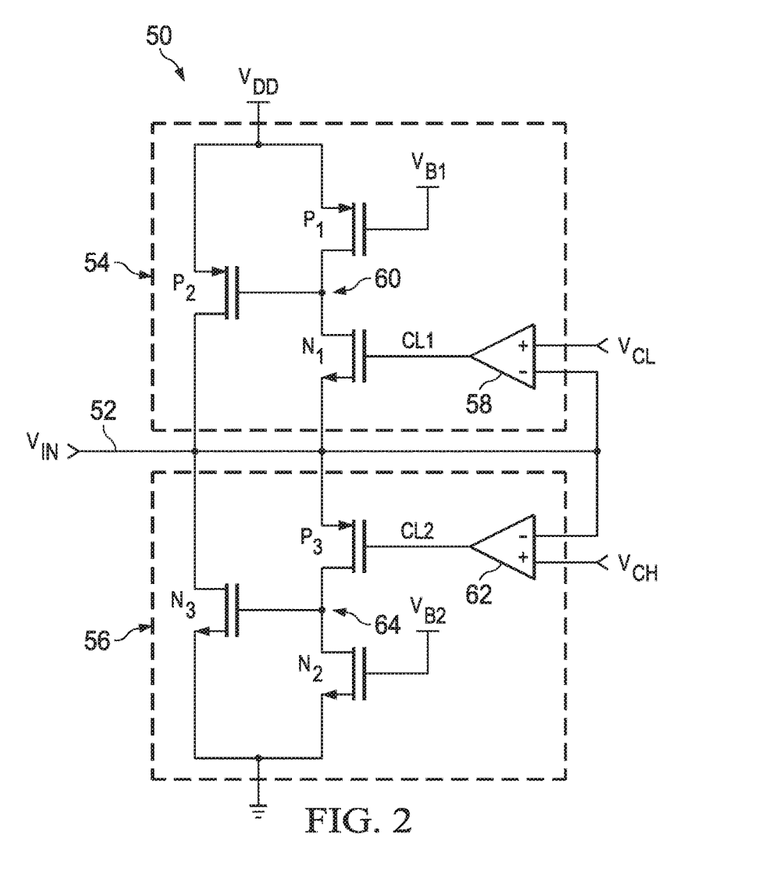
FIG. 2 illustrates another example of a voltage clamp circuit.

FIG. 2 illustrates another example of a voltage clamp circuit 50. The voltage clamp circuit 50 can be configured to clamp an input voltage $V_{IN}$ that is provided at an input node 52 at an amplitude that is approximately equal to one of a high clamping voltage $V_{CH}$ and a low clamping voltage $V_{CL}$. As an example, the clamping voltages $V_{CH}$ and $V_{CL}$ can each be programmable, and thus can vary from one application to another. Therefore, the voltage clamp circuit 50 can be configured to limit the amplitude of the input voltage $V_{IN}$ to be between the high and low clamping voltages $V_{CH}$ and $V_{CL}$. As an example, additional circuitry can be coupled to the input node 52, such as an ADC that may benefit from limiting the amplitude of the input voltage $V_{IN}$.

The voltage clamp circuit 50 is demonstrated between a high-voltage rail $V_{DD}$ and a low-voltage rail, demonstrated in the example of FIG. 2 as ground. The voltage clamp circuit 50 includes a first comparator loop circuit 54 and a second comparator loop circuit 56. The first comparator loop circuit 54 includes a comparator 58 that receives the input voltage $V_{IN}$ at an inverting input and the low clamping voltage $V_{CL}$ at a non-inverting input, and which provides an output signal CL1. The first comparator loop circuit 54 also includes a first N-channel field effect transistor (FET) $N_1$ (e.g., an N-channel metal oxide semiconductor field effect transistor (MOSFET)) having a gate that is coupled to the output of the comparator 58, having a drain coupled to a control node 60, and having a source that is coupled to the input node 52. The first comparator loop circuit 54 also includes a first P-FET (e.g., MOSFET) $P_1$ having a gate that is provided a static bias voltage $V_{B1}$, a drain coupled to the control node 60, and a source that is coupled to the high-voltage rail $V_{DD}$. Additionally, the first comparator loop circuit 54 includes a second P-FET $P_2$ having a gate that is coupled to the control node 60, having a drain coupled to the input node 52, and having a source that is coupled to the high-voltage rail $V_{DD}$. The N-FET $N_1$, the P-FET $P_1$, and the P-FET $P_2$ can correspond to the transistor network 18 of the first comparator loop circuit 54. As an example, the second P-FET $P_2$ can have a gate size (e.g., gate width and/or gate width to length ratio) that is substantially greater than the gate size (e.g., gate width and/or gate width to length ratio) of each of the N-FET $N_1$ and the P-FET $P_1$.

The comparator 58 is configured to compare the amplitude of the input voltage $V_{IN}$ with the low clamping voltage $V_{CL}$. During a steady state, and thus based on the input voltage $V_{IN}$ having an amplitude that is greater than the low clamping voltage $V_{CL}$, the static bias voltage $V_{B1}$ holds the P-FET $P_1$ in a weakly activated state (e.g., based on a low gate-source voltage to provide operation of the P-FET $P_1$ in the linear mode) and the output signal CL1 has a logic-low state, thus holding the N-FET $N_1$ in a deactivated state. As a result, the control node 60 has a voltage that is insufficient to activate the P-FET $P_2$. However, in response to the input voltage $V_{IN}$ having an amplitude that decreases less than the low clamping voltage $V_{CL}$, the comparator 58 can assert the output signal CL1 to activate the N-FET $N_1$. In response to activation of the N-FET $N_1$, the control node 60 is coupled to the input node 52 via the N-FET $N_1$ to sink the voltage of the control node 60 to approximately the amplitude of the input voltage $V_{IN}$. Therefore, the P-FET $P_2$ becomes activated to provide current from the high-voltage rail $V_{DD}$ to the input node 52. Accordingly, the current flow from the high-voltage rail $V_{DD}$ to the input node 52 can clamp the amplitude of the input voltage $V_{IN}$ to approximately the amplitude of the low clamping voltage $V_{CL}$. In other words, the input node 52, the comparator 58, and the P-FET $P_2$ can operate as a loop circuit to maintain the input voltage $V_{IN}$ at approximately the amplitude of the low clamping voltage $V_{CL}$ based on the output signal CL1 of the comparator 58 when the input voltage is less than the low clamping voltage. In response to the amplitude of the input voltage $V_{IN}$ increasing from the low clamping voltage $V_{CL}$, the comparator 58 de-asserts the output signal CL1 to deactivate the N-FET $N_1$, thus deactivating the P-FET $P_2$. Accordingly, the first comparator loop circuit 54 deactivates to cease clamping the input voltage $V_{IN}$ at the amplitude of the low clamping voltage $V_{CL}$.

The second comparator loop circuit 56 is configured substantially similar to the first comparator loop circuit 54. In the example of FIG. 2, the second comparator loop circuit 56 includes a comparator 62 that receives the input voltage $V_{IN}$ at an inverting input and the high clamping voltage $V_{CH}$ at a non-inverting input, and which provides an output signal CL2. The first comparator loop circuit 56 also includes a first P-FET $P_3$ having a gate that is coupled to the output of comparator 62, having a drain coupled to a control node 64, and having a source that is coupled to the input node 52. The second comparator loop circuit 56 also includes a first N-FET $N_2$ having a gate that is provided a static bias voltage $V_{B2}$, a drain coupled to the control node 64, and a source that is coupled to the low-voltage rail. Additionally, the second comparator loop circuit 56 includes a second N-FET $N_3$ having a gate that is coupled to the control node 64, having a drain coupled to the input node 52, and having a source that is coupled to the low-voltage rail. The P-FET $N_3$, the N-FET $N_2$, and the N-FET $N_3$ can correspond to the transistor network 18 of the second comparator loop circuit 56. As an example, the second N-FET $N_3$ can have a gate size that is substantially greater than the gate size of each of the N-FET $N_2$ and the P-FET $P_3$.

The comparator 62 is configured to compare the amplitude of the input voltage $V_{IN}$ with the high clamping voltage $V_{CH}$. During a steady state, and thus based on the input voltage $V_{IN}$ having an amplitude that is less than the high clamping voltage $V_{CH}$, the static bias voltage $V_{B2}$ holds the N-FET $N_2$ in a weakly activated state and the output signal CL2 has a logic-low state, thus holding the P-FET $P_3$ in a deactivated state. As a result, the control node 64 has a voltage that is insufficient to activate the N-FET $N_3$. However, in response to the input voltage $V_{IN}$ having an amplitude that increases greater than the high clamping voltage $V_{CH}$, the comparator 62 can assert the output signal CL2 to activate the P-FET $P_3$. In response to activation of the P-FET $P_3$, the control node 64 is coupled to the input node 52 via the P-FET $P_3$ to source the voltage of the control node 64 from the input voltage $V_{IN}$. Therefore, the N-FET $N_3$ becomes activated to provide current from the input node 52 to the low-voltage rail. Accordingly, the current flow from the input node 52 to the low-voltage rail can clamp the amplitude of the input voltage $V_{IN}$ to approximately the amplitude of the high clamping voltage $V_{CH}$. In other words, the input node 52, the comparator 62, and the N-FET $N_3$ can operate as a loop circuit to maintain the input voltage $V_{IN}$ at approximately the amplitude of the high clamping voltage $V_{CH}$ based on the output signal CL2 of the comparator 62 when the input voltage is greater than the low clamping voltage. In response to the amplitude of the input voltage $V_{IN}$ decreasing from the high clamping voltage $V_{CH}$, the comparator 62 de-asserts the output signal CL2 to deactivate the N-FET $N_3$, thus deactivating the P-FET $P_3$. Accordingly, the second comparator loop circuit 56 deactivates to cease clamping the input voltage $V_{IN}$ at the amplitude of the high clamping voltage $V_{CH}$.

The voltage clamp circuit 50 can thus provide an effective and efficient manner of clamping the input voltage $V_{IN}$ to the high clamping voltage $V_{CH}$ and the low clamping voltage $V_{CL}$ to maintain the input voltage $V_{IN}$ between the amplitudes of the high clamping voltage $V_{CH}$ and the low clamping voltage $V_{CL}$. As described previously, the high clamping voltage $V_{CH}$ and the low clamping voltage $V_{CL}$ can be programmable, and can thus provide a dynamic manner of setting the clamping amplitudes of the input voltage $V_{IN}$, as opposed to typical clamping circuits that implement diode-connections. Additionally, the arrangement of the first and second comparator loop circuits 54 and 56 is such that only the P-FET $P_2$ and the N-FET $N_3$ are sized and configured to be able to handle large current flow, and conduct approximately zero current in a non-clamping condition to substantially mitigate leakage current of the voltage clamp circuit 10. Furthermore, the voltage clamp circuit 50 is exhibited as a high impedance node when the voltage clamp circuit 50 deactivated (i.e., the input signal IN has an amplitude between the high clamping voltage $V_{CH}$ and the low clamping voltage $V_{CL}$). Therefore, the voltage clamp circuit 50 does not distort the input signal IN in the deactivated state.

Figure 3:
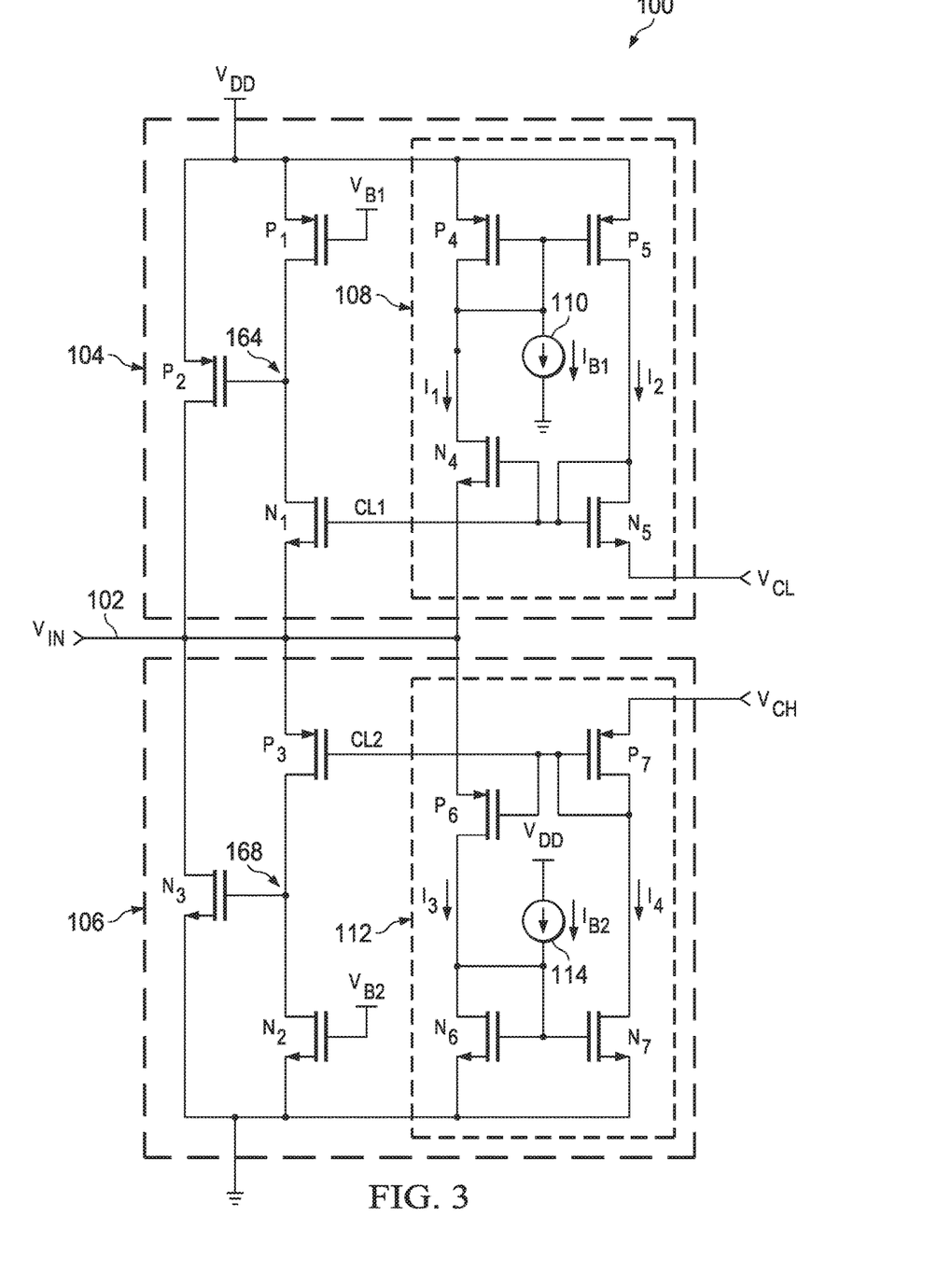
FIG. 3 illustrates yet another example of a voltage clamp circuit.

As an example, the comparators 58 and 62 can be configured as self-biasing common-gate arrangements of transistors. FIG. 3 illustrates yet another example of a voltage clamp circuit 100. As described herein, the voltage clamp circuit 100 can correspond to the voltage clamp circuit 50 in the example of FIG. 2, and can thus be configured to clamp an input voltage $V_{IN}$ that is provided at an input node 102 at an amplitude that is approximately equal to one of a high clamping voltage $V_{CH}$ and a low clamping voltage $V_{CL}$. As an example, the clamping voltages $V_{CH}$ and $V_{CL}$ can each be programmable, and thus can vary from one application to another.

The voltage clamp circuit 100 is demonstrated between a high-voltage rail $V_{DD}$ and a low-voltage rail, demonstrated in the example of FIG. 3 as ground. The voltage clamp circuit 100 includes a first comparator loop circuit 104 and a second comparator loop circuit 106. The first comparator loop circuit 104 includes a comparator 108 that is configured as a self-biasing common-gate arrangements of transistors. The comparator 108 includes a first pair of transistors, demonstrated in the example of FIG. 3 as an N-FET $N_4$ and an N-FET $N_5$. The N-FETs $N_4$ and $N_5$ include common-coupled gates that are likewise coupled to the gate of the N-FET $N_1$. Therefore, the common-coupled gates of the N-FETs $N_4$ and $N_5$ correspond to the output of the comparator 108 on which the output signal CL1 is provided. The N-FET $N_4$ has a source that is coupled to the input node 102, and the N-FET $N_5$ has a source that is coupled to the low clamping voltage $V_{CL}$. Additionally, the N-FET $N_5$ is diode-connected.

The comparator 108 also includes a second pair of transistors, demonstrated in the example of FIG. 3 as a P-FET $P_4$ and a P-FET $P_5$ that include common-coupled gates, and are arranged as a current-mirror. In the example of FIG. 3, the P-FETs $P_4$ and $P_5$ have gates that are controlled by a static current source 110 to provide a very small amplitude current $I_{B1}$ (e.g., approximately 1 μA) that flows from the gates to ground to provide a substantially weak activation of the P-FETs $P_4$ and $P_5$. The P-FETs $P_4$ and $P_5$ have sources that are coupled to the high-voltage rail $V_{DD}$, and have drains that are coupled to the respective drains of the N-FETs $N_4$ and $N_5$. The current-mirror configuration of the P-FETs $P_4$ and $P_5$ is such that the current flow through the respective P-FETs $P_4$ and $P_5$ is driven to be approximately equal.

The comparator 108 operates similar to as described in the example of FIG. 2 to compare the amplitude of the input voltage $V_{IN}$ with the low clamping voltage $V_{CL}$. During a steady state, and thus based on the input voltage $V_{IN}$ having an amplitude that is greater than the low clamping voltage $V_{CL}$, the N-FET $N_4$ has a smaller gate-source voltage than the N-FET $N_5$. Therefore, a current $I_1$, having a relatively small amplitude based on a relatively small gate-source voltage of the N-FET $N_4$, flows from the high-voltage rail $V_{DD}$ to the input node 102 through the P-FET $P_4$ and the N-FET $N_4$. The current $I_1$ is thus mirrored as a current $I_2$, having a current amplitude that is approximately equal to the current $I_1$, that flows through the P-FET $P_5$ and the N-FET $N_5$ based on the current-mirror configuration of the P-FETs $P_4$ and $P_5$. As described previously, the current-mirror configuration of the N-FETs $N_4$ and $N_5$ is such that the current flow through the respective N-FETs $N_4$ and $N_5$ is driven to be approximately equal. Thus, based on the relatively small amplitude of the current $I_2$, the drain-gate voltage of the N-FET $N_5$ decreases to adjust the gate-source voltage of the N-FET $N_5$ to maintain the current $I_2$ to be approximately equal to the relatively small amplitude of the current $I_1$.

Therefore, as a result of the relatively small amplitude of the current $I_1$, and thus also the current $I_2$, the N-FET $N_5$ is driven to have a decreased gate-source voltage. The decrease of the amplitude of the drain voltage of the N-FET $N_5$ therefore likewise results in a decrease in the amplitude of the gate voltage of all of the N-FETs $N_1$, $N_4$, and $N_5$. The gate voltage of the N-FET $N_4$ thus decreases the amplitude of the current $I_1$ more, and thus likewise decreases the current $I_2$. As a result, the continued decrease in the amplitude of the gate voltages of the N-FETs $N_1$, $N_4$, and $N_5$ corresponds to a logic-low state of the output signal CL1, which thus corresponds to deactivation of the N-FET $N_1$. Accordingly, the first comparator loop circuit 104 can operate in the steady state while the input voltage $V_{IN}$ has an amplitude that is greater than the low clamping voltage $V_{CL}$.

In response to the input voltage $V_{IN}$ decreasing less than the low clamping voltage $V_{CL}$, the N-FET $N_4$ has a larger gate-source voltage than the N-FET $N_5$. Therefore, the current $I_1$ that flows from the high-voltage rail $V_{DD}$ to the input node 102 through the P-FET $P_4$ and the N-FET $N_4$ increases in amplitude relative to the steady-state. The current $I_1$ is thus mirrored as the current $I_2$ having a likewise increased current amplitude relative to the steady-state, and therefore flows through the P-FET $P_5$ and the N-FET $N_5$ based on the current-mirror configuration of the P-FETs $P_4$ and $P_5$. Thus, the N-FET $N_5$ is driven to have a gate-source voltage that is approximately equal to the relatively larger gate-source voltage of the N-FET $N_4$. Based on the diode-connected configuration and constant source voltage of the N-FET $N_5$, the increase of the gate-source voltage of the N-FET $N_5$ results in an increase of the amplitude of the drain voltage of the N-FET $N_5$, and thus an increase in the amplitude of the gate voltage of the N-FETs $N_1$, $N_4$, and $N_5$. The gate voltage of the N-FET $N_4$ thus increases the amplitude of the current $I_1$ more, and thus likewise increases the current $I_2$. As a result, the continued increase in the amplitude of the gate voltages of the N-FETs $N_1$, $N_4$, and $N_5$ corresponds to a logic-high state of the output signal CL1, which thus activates the N-FET $N_1$. Accordingly, the N-FET $N_1$ and the P-FET $P_2$ can thus activate to provide current flow to the input node 102 as described previously. Based on the current-mirror configuration of the P-FETs $P_4$ and $P_5$ to maintain the currents $I_1$ and $I_2$ to be approximately equal, the comparator 108 can maintain the gate-source voltages of the respective N-FETs $N_4$ and $N_5$ to be approximately equal to clamp the input voltage $V_{IN}$ at approximately the amplitude of the low clamping voltage $V_{CL}$.

The second comparator loop circuit 106 includes a comparator 112 that is configured as a self-biasing common-gate arrangements of transistors. The comparator 112 includes a first pair of transistors, demonstrated in the example of FIG. 3 as a P-FET $P_6$ and a P-FET $P_7$. The P-FETs $P_6$ and $P_7$ include common-coupled gates that are likewise coupled to the gate of the P-FET $P_3$. Therefore, the common-coupled gates of the P-FETs $P_6$ and $P_7$ correspond to the output of the comparator 112 on which the output signal CL2 is provided. The P-FET $P_6$ has a source that is coupled to the input node 102, and the P-FET $P_7$ has a source that is coupled to the high clamping voltage $V_{CH}$. Additionally, the P-FET $P_7$ is diode-connected.

The comparator 112 also includes a second pair of transistors, demonstrated in the example of FIG. 3 as an N-FET $N_6$ and an N-FET $N_7$ that include common-coupled gates, and are thus arranged as a current-mirror. In the example of FIG. 3, the N-FETs $N_6$ and $N_7$ have gates that are controlled by a static current source 114 to provide a very small amplitude current $I_{B2}$ (e.g., approximately 1 μA) that flows to the gates from the high-voltage rail $V_{DD}$ to provide a substantially weak activation of the N-FETs $N_6$ and $N_7$. The N-FETs $N_6$ and $N_7$ have sources that are coupled to the low-voltage rail, and have drains that are coupled to the respective drains of the P-FETs $P_6$ and $P_7$. The current-mirror configuration of the N-FETs $N_6$ and $N_7$ is such that the current flow through the respective N-FETs $N_6$ and $N_7$ is driven to be approximately equal.

The comparator 112 operates similar to as described in the example of FIG. 2 to compare the amplitude of the input voltage $V_{IN}$ with the high clamping voltage $V_{CH}$. During a steady state, and thus based on the input voltage $V_{IN}$ having an amplitude that is less than the high clamping voltage $V_{CH}$, the P-FET $P_6$ has a smaller gate-source voltage than the P-FET $P_7$. Therefore, a current $I_3$, having a relatively small amplitude, based on a relatively small gate-source voltage of the P-FET $P_6$, flows from the input node 102 to the low-voltage rail through the N-FET $N_6$ and the P-FET $P_6$. The current $I_3$ is thus mirrored as a current $I_4$, having a current amplitude that is approximately equal to the current $I_3$, that flows through the N-FET $N_7$ and the P-FET $P_7$ based on the current-mirror configuration of the N-FETs $N_6$ and $N_7$. As described previously, the current-mirror configuration of the N-FETs $N_6$ and $N_7$ is such that the current flow through the respective P-FETs $P_6$ and $P_7$ is driven to be approximately equal. Thus, based on the relatively small amplitude of the current $I_4$, the drain-gate voltage of the P-FET $P_7$ increases to adjust the gate-source voltage of the P-FET $P_7$ to maintain the current $I_4$ to be approximately equal to the relatively small amplitude of the current $I_3$. Therefore, as a result of the relatively small amplitude of the current $I_3$, and thus also the current $I_4$, the P-FET $P_7$ is driven to have an increased gate-source voltage. The increase of the amplitude of the drain voltage of the P-FET $P_7$ therefore likewise results in an increase in the amplitude of the gate voltage of all of the P-FETs $P_3$, $P_6$, and $P_7$. The gate voltage of the P-FET $P_6$ thus decreases the amplitude of the current $I_3$ more, and thus likewise decreases the current $I_4$. As a result, the continued increase in the amplitude of the gate voltages of the P-FETs $P_3$, $P_6$, and $P_7$ corresponds to a logic-high state of the output signal CL2, which thus corresponds to deactivation of the P-FET $P_3$. Accordingly, the second comparator loop circuit 106 can operate in the steady state while the input voltage $V_{IN}$ has an amplitude that is less than the high clamping voltage $V_{CH}$.

In response to the input voltage $V_{IN}$ increasing greater than the high clamping voltage $V_{CH}$, the P-FET $P_6$ has a larger gate-source voltage than the P-FET $P_7$. Therefore, the current $I_3$ that flows from the input node 102 to the low-voltage rail through the N-FET $N_6$ and the P-FET $P_6$ increases in amplitude relative to the steady-state. The current $I_3$ is thus mirrored as the current $I_4$ having a likewise increased current amplitude relative to the steady-state, and therefore flows through the N-FET $N_7$ and the P-FET $P_7$ based on the current-mirror configuration of the N-FETs $N_6$ and $N_7$. Based on the diode-connected configuration and constant source voltage of the P-FET $P_7$, the decrease of the gate-source voltage of the P-FET $P_7$ results in a decrease of the amplitude of the drain voltage of the P-FET $P_7$, and thus a decrease in the amplitude of the gate voltage of the P-FETs $P_3$, $P_6$, and $P_7$. The gate voltage of the P-FET $P_6$ thus increases the amplitude of the current $I_3$ more, and thus likewise increases the current $I_4$. As a result, the continued decrease in the amplitude of the gate voltages of the P-FETs $P_3$, $P_6$, and $P_7$ corresponds to a logic-low state of the output signal CL2, which thus activates the P-FET $P_3$. Accordingly, the N-FET $N_3$ and the P-FET $P_3$ can thus activate to provide current flow from the input node 102 as described previously. Based on the current-mirror configuration of the N-FETs $N_6$ and $N_7$ to maintain the currents $I_3$ and $I_4$ to be approximately equal, the comparator 112 can maintain the gate-source voltages of the respective P-FETs $P_6$ and $P_7$ to be approximately equal to clamp the input voltage $V_{IN}$ at approximately the amplitude of the high clamping voltage $V_{CH}$.

Based on the comparators 108 and 112 being arranged as self-biasing common-gate arrangements of transistors, the voltage clamp circuit 100 can be a more effective voltage clamp circuit relative to typical voltage clamp circuits. For example, the self-biasing architecture can facilitate operation of the voltage clamp circuit 100 in low voltage environments to facilitate rapid voltage clamping of the input voltage $V_{IN}$ in thin-oxide devices. Additionally, the self-biasing architecture also provides that the N-FET $N_1$ and the P-FET $P_1$ are deactivated during a non-clamping condition to provide substantially zero nonlinear current flow through the N-FET $N_1$ and the P-FET $P_1$, respectively. Furthermore, the use of the static biasing currents $I_{B1}$ and $I_{B2}$ with respect to the P-FETs $P_4$ and $P_5$ and the N-FETs $N_6$ and $N_7$, respectively, provides for substantially more rapid clamping with substantially minimal overshoot of the clamping with respect to the input voltage $V_{IN}$. Accordingly, the voltage clamp circuit 100 can provide significant benefits over typical clamping circuits, such as those that implement diode-based clamping.

Figure 4:
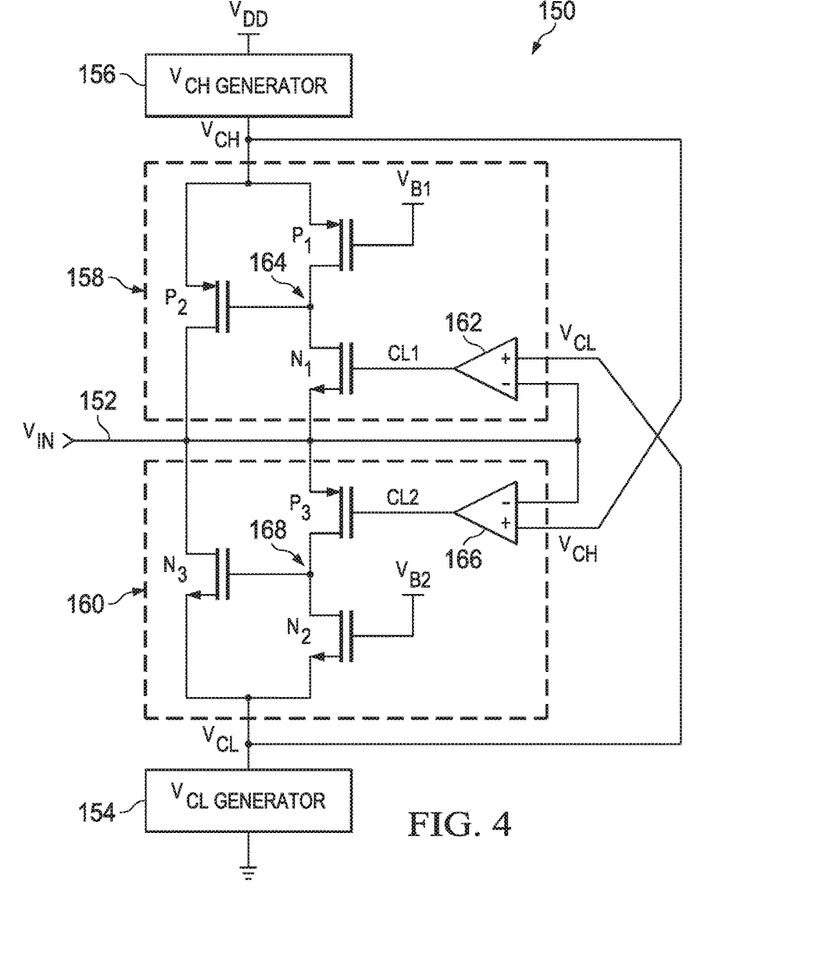
FIG. 4 illustrates yet another example of a voltage clamp circuit.

FIG. 4 illustrates yet another example of a voltage clamp circuit 150. The voltage clamp circuit 150 can be configured to clamp an input voltage $V_{IN}$ that is provided at an input node 152 at an amplitude that is approximately equal to one of a high clamping voltage $V_{CH}$ and a low clamping voltage $V_{CL}$. The voltage clamp circuit 150 can be configured similar to the voltage clamp circuits 50 and 100 in the examples of FIGS. 2 and 3, respectively.

The voltage clamp circuit 150 is demonstrated between a high-voltage rail $V_{DD}$ (e.g., approximately 1.8 volts) and a low-voltage rail, demonstrated in the example of FIG. 4 as ground. The voltage clamp circuit 150 includes a first voltage generator 154 coupled to the low-voltage rail and being configured to generate the low clamping voltage $V_{CL}$ (e.g., approximately 0.55 volts), such as based on the high-voltage rail $V_{DD}$. The voltage clamp circuit 150 also includes a second voltage generator 156 coupled to the high-voltage rail $V_{DD}$ and being configured to generate the low clamping voltage $V_{CH}$ (e.g., approximately 1.55 volts), such as based on the high-voltage rail $V_{DD}$. Accordingly, the voltage clamp circuit 150 can be implemented, for example, in any of a variety of submicron CMOS technologies that include dual power supplies.

The voltage clamp circuit 150 includes a first comparator loop circuit 158 and a second comparator loop circuit 160. The first comparator loop circuit 158 includes a comparator 162 that receives the input voltage $V_{IN}$ at an inverting input and the low clamping voltage $V_{CL}$ at a non-inverting input, and which provides an output signal CL1. The first comparator loop circuit 158 also includes a first N-FET (e.g., MOSFET) $N_1$ having a gate that is coupled to the output of the comparator 162, having a drain coupled to a control node 164, and having a source that is coupled to the input node 152. The first comparator loop circuit 158 also includes a first P-FET (e.g., MOSFET) $P_1$ having a gate that is provided a static bias voltage $V_{B1}$, a drain coupled to the control node 164, and a source that is coupled to the second voltage generator 156, and therefore the high clamping voltage $V_{CH}$. Additionally, the first comparator loop circuit 158 includes a second P-FET $P_2$ having a gate that is coupled to the control node 164, having a drain coupled to the input node 152, and having a source that is coupled to the second voltage generator 156, and therefore the high clamping voltage $V_{CL}$. As an example, the second P-FET $P_2$ can have a gate size that is substantially greater than the gate size of each of the N-FET $N_1$ and the P-FET $P_1$.

The comparator 162 is configured to compare the amplitude of the input voltage $V_{IN}$ with the low clamping voltage $V_{CL}$. During a steady state, and thus based on the input voltage $V_{IN}$ having an amplitude that is greater than the low clamping voltage $V_{CL}$, the static bias voltage $V_{B1}$ holds the P-FET $P_1$ in a weakly activated state and the output signal CL1 has a logic-low state, thus holding the N-FET $N_1$ in a deactivated state. As a result, the control node 164 has a voltage that is insufficient to activate the P-FET $P_2$. However, in response to the input voltage $V_{IN}$ having an amplitude that decreases less than the low clamping voltage $V_{CL}$, the comparator 162 can assert the output signal CL1 to activate the N-FET $N_1$. In response to activation of the N-FET $N_1$, the control node 164 is coupled to the input node 152 via the N-FET $N_1$ to sink the voltage of the control node 164 to approximately the amplitude of the input voltage $V_{IN}$. Therefore, the P-FET $P_2$ becomes activated to provide current from the high clamping voltage $V_{CH}$ to the input node 152. Accordingly, the current flow from the high clamping voltage $V_{CH}$ to the input node 152 can clamp the amplitude of the input voltage $V_{IN}$ to approximately the amplitude of the low clamping voltage $V_{CL}$. In other words, the input node 152, the comparator 162, and the P-FET $P_2$ can operate as a loop circuit to maintain the input voltage $V_{IN}$ at approximately the amplitude of the low clamping voltage $V_{CL}$ based on the output signal CL1 of the comparator 162.

The second comparator loop circuit 160 is configured substantially similar to the first comparator loop circuit 158. In the example of FIG. 4, the second comparator loop circuit 160 includes a comparator 166 that receives the input voltage $V_{IN}$ at an inverting input and the high clamping voltage $V_{CH}$ at a non-inverting input, and which provides an output signal CL2. The first comparator loop circuit 160 also includes a first P-FET $P_3$ having a gate that is coupled to the output of the comparator 166, having a drain coupled to a control node 168, and having a source that is coupled to the input node 152. The second comparator loop circuit 160 also includes a first N-FET $N_2$ having a gate that is provided a static bias voltage $V_{B2}$, a drain coupled to the control node 168, and a source that is coupled to the first voltage generator 154, and therefore the low clamping voltage $V_{CL}$. Additionally, the second comparator loop circuit 160 includes a second N-FET $N_3$ having a gate that is coupled to the control node 168, having a drain coupled to the input node 152, and having a source that is coupled to the first voltage generator 154, and therefore the low clamping voltage $V_{CL}$. As an example, the second N-FET $N_3$ can have a gate size that is substantially greater than the gate size of each of the N-FET $N_2$ and the P-FET $P_3$.

The comparator 166 is configured to compare the amplitude of the input voltage $V_{IN}$ with the high clamping voltage $V_{CH}$. During a steady state, and thus based on the input voltage $V_{IN}$ having an amplitude that is less than the high clamping voltage $V_{CB}$, the static bias voltage $V_{B2}$ holds the N-FET $N_2$ in a weakly activated state and the output signal CL2 has a logic-low state, thus holding the P-FET $P_3$ in a deactivated state. As a result, the control node 168 has a voltage that is insufficient to activate the N-FET $N_3$. However, in response to the input voltage $V_{IN}$ having an amplitude that increases greater than the high clamping voltage $V_{CH}$, the comparator 166 can assert the output signal CL2 to activate the P-FET $P_3$. In response to activation of the P-FET $P_3$, the control node 168 is coupled to the input node 152 via the P-FET $P_3$ to source the voltage of the control node 168 from the input voltage $V_{IN}$. Therefore, the N-FET $N_3$ becomes activated to provide current from the input node 152 to the low clamping voltage $V_{CL}$. Accordingly, the current flow from the input node 152 to the low clamping voltage $V_{CL}$ can clamp the amplitude of the input voltage $V_{IN}$ to approximately the amplitude of the high clamping voltage $V_{CH}$. In other words, the input node 152, the comparator 166, and the N-FET $N_3$ can operate as a loop circuit to maintain the input voltage $V_{IN}$ at approximately the amplitude of the high clamping voltage $V_{CH}$ based on the output signal CL2 of the comparator 166.

Figure 5:
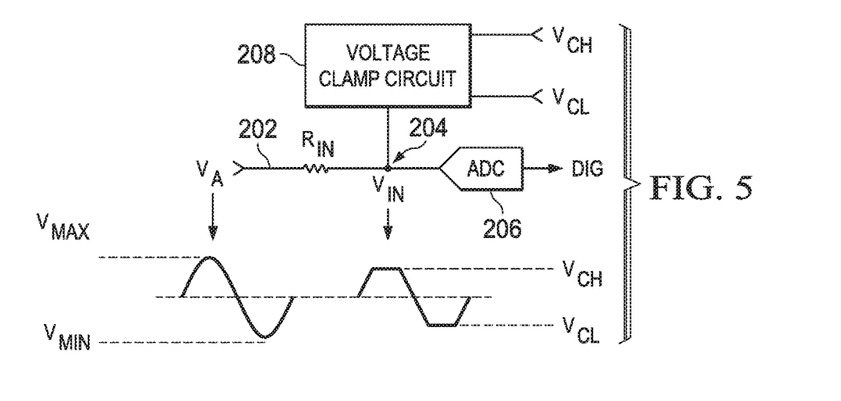
FIG. 5 illustrates an example of an analog-to-digital converter system.

FIG. 5 illustrates an example of an ADC system 200. The ADC system 200 can be implemented in any of a variety of applications to convert an analog voltage $V_A$ to a digital signal DIG. The ADC system 200 includes a resistor $R_{IN}$ that separates a first node 202 on which the analog voltage $V_A$ is provided and an input node 204 that can correspond to the input node 12, 52, 102, and 152 in the respective examples of FIGS. 1-4. Thus, the input node 204 has a voltage $V_{IN}$ that can correspond to the voltage $V_{IN}$ in the respective examples of FIGS. 1-4. Therefore, the input voltage $V_{IN}$ can be converted to the digital signal DIG via an ADC 206.

The ADC system 200 can also include a voltage clamp circuit 208 that is configured to clamp the input voltage $V_{IN}$ to between the high clamping voltage $V_{CH}$ and the low clamping voltage $V_{CL}$, such as being programmable or generated via respective voltage generators (e.g., the voltage generators 154 and 156 in the example of FIG. 4). Thus, while the analog voltage $V_A$ can be provided to have a maximum amplitude of $V_{MAX}$ and a minimum amplitude of $V_{MIN}$, the voltage clamp circuit 208 can be configured to clamp the input voltage to have a maximum amplitude that is approximately equal to the high clamping voltage $V_{CH}$ and to have a minimum that is approximately equal to the high clamping voltage $V_{CL}$. Accordingly, the voltage clamp circuit 208 can substantially protect the ADC 206 from damage, such as resulting from voltage swings between the maximum voltage $V_{MAX}$ and the minimum voltage $V_{MIN}$ of the analog voltage $V_A$.

What have been described above are examples of the disclosure. It is, of course, not possible to describe every conceivable combination of components or method for purposes of describing the disclosure, but one of ordinary skill in the art will recognize that many further combinations and permutations of the disclosure are possible. Accordingly, the disclosure is intended to embrace all such alterations, modifications, and variations that fall within the scope of this application, including the appended claims.

What is claimed is:

1. A voltage clamp circuit comprising:
    a comparator loop circuit comprising:
        a comparator configured to compare an input voltage provided at an input node with a clamping voltage; and
        a transistor network interconnecting a voltage rail and the input node, the comparator being configured to activate the transistor network to set the input voltage to be approximately equal to the clamping voltage in response to the input voltage exceeding the clamping voltage.

2. The circuit of claim 1, wherein the comparator is configured as a self-biasing common-gate arrangement of transistors.

3. The circuit of claim 1, wherein the comparator comprises:
    a first pair of transistors comprising common-coupled control terminals corresponding to an output of the comparator, wherein one of the first pair of transistors comprises a terminal coupled to the input node and the other of the first pair of transistors comprises a terminal coupled to the clamping voltage; and
    a second pair of transistors arranged as a current-mirror controlled by a static current source, wherein each of the second pair of transistors comprises a first terminal coupled to the voltage rail and a second terminal coupled to a second respective terminal of each of the first pair of transistors.

4. The circuit of claim 1, wherein the transistor network comprises:
    a first transistor activated by an output of the comparator; and
    a second transistor interconnecting the input node and the voltage rail and being controlled by the first transistor.

5. The circuit of claim 4, wherein the transistor network comprises a third transistor that is coupled to the voltage rail and the first transistor, the third transistor being controlled via a first bias voltage to cooperate with the first transistor to control the second transistor.

6. The circuit of claim 1, wherein the clamping voltage is programmable, and wherein the comparator loop circuit is configured to couple the input node to the voltage rail in response to the input voltage exceeding the clamping voltage to set the input voltage approximately equal to the clamping voltage.

7. The circuit of claim 1, further comprising a voltage generator coupled between the voltage rail and the comparator loop circuit, the voltage generator being configured to generate the clamping voltage, wherein the comparator loop circuit is configured to couple the input node to the clamping voltage of the voltage generator based on the comparator detecting that the input voltage exceeds the clamping voltage to set the input voltage approximately equal to the clamping voltage.

8. The circuit of claim 1, wherein the clamping voltage comprises a low clamping voltage and a high clamping voltage, wherein the comparator loop circuit comprises:
    a first comparator loop circuit comprising:
        a first comparator configured to compare the input voltage with the low clamping voltage and to assert an output of the first comparator in response to the input voltage decreasing less than the low clamping voltage; and
        a first transistor network interconnecting the input node and the high voltage rail, the first comparator being configured to activate the first transistor network to set the input voltage to be approximately equal to the low clamping voltage in response to the input voltage decreasing less than the low clamping voltage; and
    a second comparator loop circuit comprising:
        a second comparator configured to compare the input voltage with the high clamping voltage and to assert an output of the second comparator in response to the input voltage increasing greater than the high clamping voltage; and
        a second transistor network interconnecting the input node and the low voltage rail, the second comparator being configured to activate the second transistor network to set the input voltage to be approximately equal to the high clamping voltage in response to the input voltage increasing greater than the high clamping voltage.

9. An analog-to-digital converter (ADC) system comprising the voltage clamp circuit of claim 1, the ADC system further comprising:
an input resistor connected between an analog voltage input and the input node, the input voltage being generated at the input node based on an analog voltage provided at the analog voltage input; and
an ADC coupled to the input node and being configured to generate a digital signal based on the input voltage.

10. A voltage clamp circuit comprising:
a first comparator loop circuit comprising a first comparator configured to compare an input voltage with a low clamping voltage and to assert an output in response to the input voltage decreasing less than the low clamping voltage to activate a first transistor network to set the input voltage approximately equal to the low clamping voltage; and
a second comparator loop circuit comprising a second comparator configured to compare the input voltage with a high clamping voltage and to assert an output in response to the input voltage increasing greater than the high clamping voltage to activate a second transistor network set the input voltage approximately equal to the high clamping voltage.

11. The circuit of claim 10, wherein each of the first comparator and the second comparator is configured as a self-biasing common-gate arrangement of transistors.

12. The circuit of claim 10, wherein the first transistor network comprises a first transistor arrangement activated by the first comparator and being configured to control a second transistor interconnecting the input node and a high-voltage rail, wherein the second transistor network comprises a third transistor activated by the second comparator and being configured to control a fourth transistor interconnecting the input node and a low-voltage rail.

13. The circuit of claim 12, wherein the second transistor is further controlled by a fifth transistor that is coupled to the high-voltage rail and is controlled via a first bias voltage, and wherein the fourth transistor is further controlled by a sixth transistor that is coupled to the low-voltage rail and is controlled via a second bias voltage.

14. The circuit of claim 10, wherein each of the high and low clamping voltages are programmable, and wherein the first comparator loop circuit is configured to couple the input node to a high-voltage rail in response to the input voltage decreasing less than the low clamping voltage to set the input voltage approximately equal to the low clamping voltage, and wherein the second comparator loop circuit is configured to couple the input node to a low-voltage rail in response to the input voltage increasing greater than the high clamping voltage to set the input voltage approximately equal to the high clamping voltage.

15. The circuit of claim 10, further comprising:
a first voltage generator coupled to a low-voltage rail and configured to generate the low clamping voltage; and
a second voltage generator coupled to a high-voltage rail and configured to generate the high clamping voltage;
wherein the first comparator loop circuit is configured to couple the input node to the second voltage generator in response to the input voltage decreasing less than the low clamping voltage to set the input voltage approximately equal to the low clamping voltage, and wherein the second comparator loop circuit is configured to couple the input node to the first voltage generator in response to the input voltage increasing greater than the high clamping voltage to set the input voltage approximately equal to the high clamping voltage.

16. An analog-to-digital converter (ADC) system comprising the voltage clamp circuit of claim 11, the ADC system further comprising:
an input resistor interconnecting an analog voltage input and the input node, the input voltage being generated based on an analog voltage provided at the analog voltage input; and
an ADC coupled to the input node and being configured to generate a digital signal based on the input voltage.

17. An analog-to-digital converter (ADC) circuit system comprising:
an input resistor connected between an analog voltage input and an ADC input node;
a voltage clamp circuit coupled to the ADC input node, the voltage clamp circuit comprising a comparator loop circuit, the comparator loop circuit comprising:
a comparator configured to compare an input voltage provided at an input node with a clamping voltage; and
a transistor network interconnecting a voltage rail and the input node, the comparator being configured to activate the transistor network to set the input voltage to be approximately equal to the clamping voltage in response to the input voltage exceeding the corresponding clamping voltage; and
an ADC coupled to the ADC input node and being configured to generate a digital signal based on the input voltage.

18. The ADC circuit system of claim 17, wherein the transistor network comprises a first transistor activated by the comparator and being configured to control a second transistor interconnecting the input node and the voltage rail.

19. The ADC circuit system of claim 17, further comprising a voltage generator coupled to the voltage rail and configured to generate the clamping voltage, wherein the comparator loop circuit is configured to couple the input node to the voltage generator in response to the input voltage exceeding the clamping voltage to set the input voltage approximately equal to the clamping voltage.

20. The ADC circuit system of claim 17, wherein the clamping voltage comprises a low clamping voltage and a high clamping voltage, wherein the comparator loop circuit comprises:
a first comparator loop circuit comprising:
a first comparator configured to compare the input voltage with the low clamping voltage and to assert an output of the first comparator in response to the input voltage decreasing less than the low clamping voltage; and
a first transistor network interconnecting the input node and the high voltage rail, the first comparator being configured to activate the first transistor network to set the input voltage to be approximately equal to the low clamping voltage in response to the input voltage decreasing less than the low clamping voltage; and
a second comparator loop circuit comprising:
a second comparator configured to compare the input voltage with the high clamping voltage and to assert an output of the second comparator in response to the input voltage increasing greater than the high clamping voltage; and a second transistor network interconnecting the input node and the low voltage rail, the first comparator being configured to activate the first transistor network to set the input voltage to be approximately equal to the high clamping voltage in response to the input voltage increasing greater than the high clamping voltage.

* * * * *